(12) United States Patent
Tomioka

(10) Patent No.: US 7,319,587 B2
(45) Date of Patent: Jan. 15, 2008

(54) ELECTRONIC APPARATUS HAVING PUMP UNIT

(75) Inventor: Kentaro Tomioka, Sayama (JP)

(73) Assignee: Kabushiki Kaisha Toshiba, Tokyo (JP)

(\*) Notice: Subject to any disclaimer, the term of this patent is extended or adjusted under 35 U.S.C. 154(b) by 604 days.

(21) Appl. No.: 10/945,561

(22) Filed: Sep. 21, 2004

(65) Prior Publication Data
US 2005/0069432 A1  Mar. 31, 2005

(30) Foreign Application Priority Data
Sep. 30, 2003 (JP) .............................. 2003-339984

(51) Int. Cl.
*H05K 7/20* (2006.01)
(52) U.S. Cl. ...................... 361/687; 361/699; 361/702; 165/80.4; 417/353; 417/413.2
(58) Field of Classification Search ................ 361/687, 361/689, 697–699, 700–711; 174/15.1, 16.3; 257/714–716; 165/80.3, 80.4, 104.33, 104.21; 417/55.1, 429, 423.8, 423.14, 420, 420.1, 417/352, 353, 354, 55.2, 55.3, 55.4, 176, 417/177, 178; 62/259.1, 259.2
See application file for complete search history.

(56) References Cited

U.S. PATENT DOCUMENTS

| 6,510,052 B2 * | 1/2003 | Ishikawa et al. ............ 361/687 |
| 6,668,911 B2 * | 12/2003 | Bingler ...................... 165/80.4 |
| 6,728,102 B2 * | 4/2004 | Ishikawa et al. ............ 361/687 |
| 6,755,626 B2 * | 6/2004 | Komatsu et al. ......... 417/413.2 |
| 6,757,169 B2 * | 6/2004 | Kondo et al. ................ 361/699 |
| 6,795,312 B2 * | 9/2004 | Narakino et al. ........... 361/687 |
| 6,808,371 B2 * | 10/2004 | Niwatsukino et al. ...... 417/353 |
| 6,839,234 B2 * | 1/2005 | Niwatsukino et al. ...... 361/695 |
| 6,894,899 B2 * | 5/2005 | Wu et al. .................... 361/699 |

FOREIGN PATENT DOCUMENTS

JP    2002-099356    4/2002

\* cited by examiner

*Primary Examiner*—Michael Datskovskiy
(74) *Attorney, Agent, or Firm*—Pillsbury Winthrop Shaw Pittman, LLP

(57) ABSTRACT

An electronic apparatus includes a housing having a heat generating component, a heat radiating portion which radiates heat generated by the heat generating component, a pump unit having an impeller and a heat receiving portion thermally connected to the heat generating component, wherein the pump unit supplies liquid to the heat radiating portion by rotating the impeller, and a circulation path which circulates the liquid between the heat receiving portion and the heat radiating portion and transfers the heat generated by the heat generating component to the heat radiating portion through the liquid. The pump unit is arranged such that the center of the impeller is deviated from the center of the heat generating component.

19 Claims, 7 Drawing Sheets

ELECTRONIC APPARATUS HAVING PUMP UNIT

CROSS-REFERENCE TO RELATED APPLICATIONS

This application is based upon and claims the benefit of priority from prior Japanese Patent Application No. 2003-339984, filed Sep. 30, 2003, the entire contents of which are incorporated herein by reference.

BACKGROUND OF THE INVENTION

1. Field of the Invention

The present invention relates to an electronic apparatus having a pump unit.

2. Description of the Related Art

A CPU (Central Processing Unit) for use in an electronic apparatus tends to generate increased heat during operation, as the processing speed is increased or the functions thereof are expanded. As a countermeasure against heat, an electronic apparatus employing a so-called liquid cooling system is disclosed in Jpn. Pat. Appln. KOKAI Publication No. 2002-99356. In this electronic apparatus, the CPU is cooled by a coolant, whose specific heat is much higher than that of air.

However, in the field of electronic apparatuses, there is a demand for a cooling system that can more efficiently cool a heat-generating component, such as a CPU.

BRIEF SUMMARY OF THE INVENTION

According to an embodiment of the present invention, there is provided an electronic apparatus comprising: a housing having a heat generating component; a heat radiating portion which radiates heat generated by the heat generating component; a pump unit having an impeller and a heat receiving portion thermally connected to the heat generating component, wherein a center of the impeller is deviated from a center of the heat generating component and the pump unit supplies liquid to the heat radiating portion by rotating the impeller; and a circulation path which circulates the liquid between the heat receiving portion and the heat radiating portion and transfers the heat generated by the heat generating component to the heat radiating portion through the liquid.

DETAILED DESCRIPTION OF THE INVENTION

A first embodiment of the present invention will be described with reference to FIGS. 1 to 9.

Figure 1:
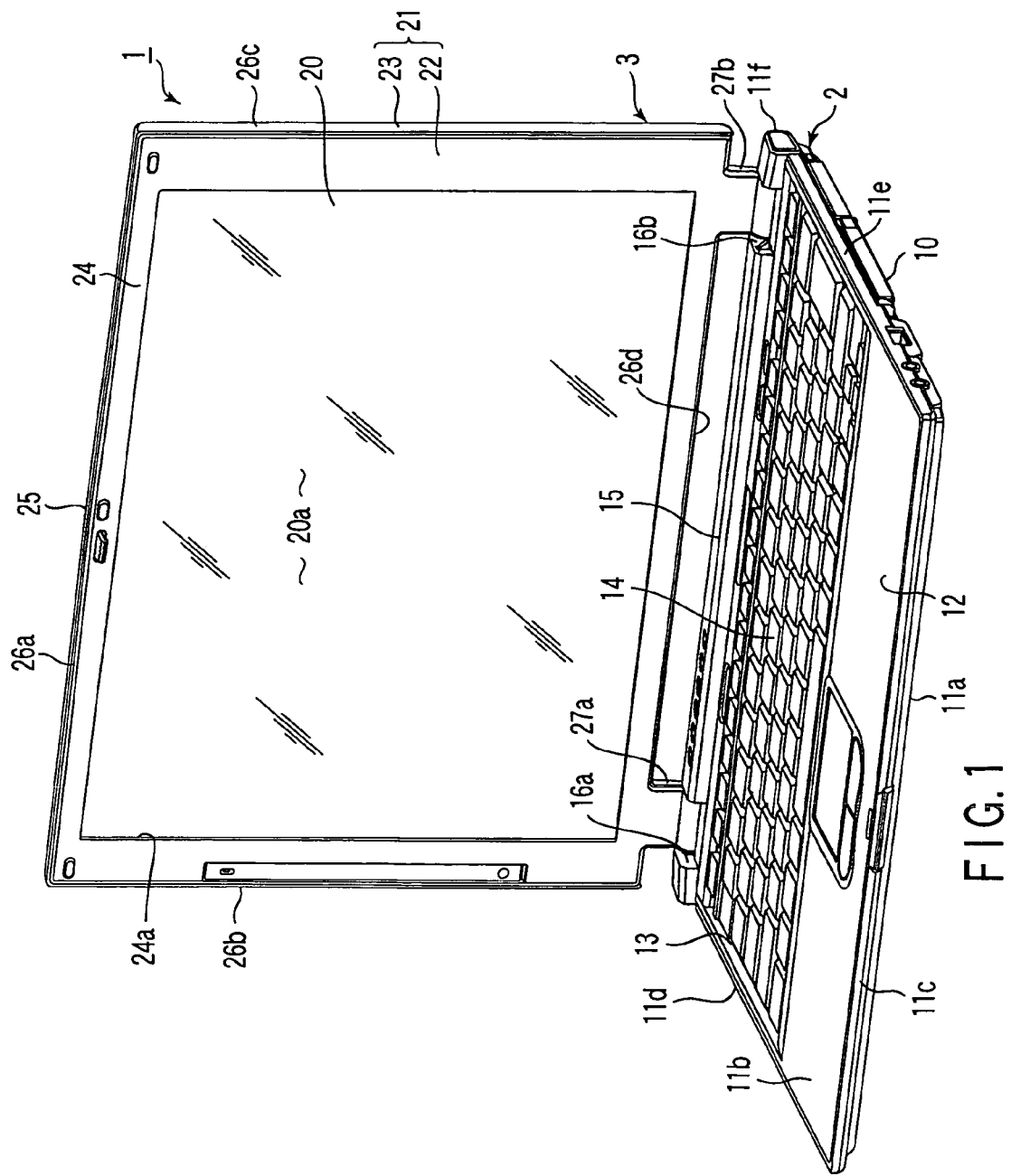
FIG. 1 is a perspective view showing a portable computer according to a first embodiment of the present invention.

FIG. 1 discloses a portable computer 1 as an electronic apparatus. The portable computer 1 comprises an apparatus main body 2 and a display unit 3.

Figure 2:
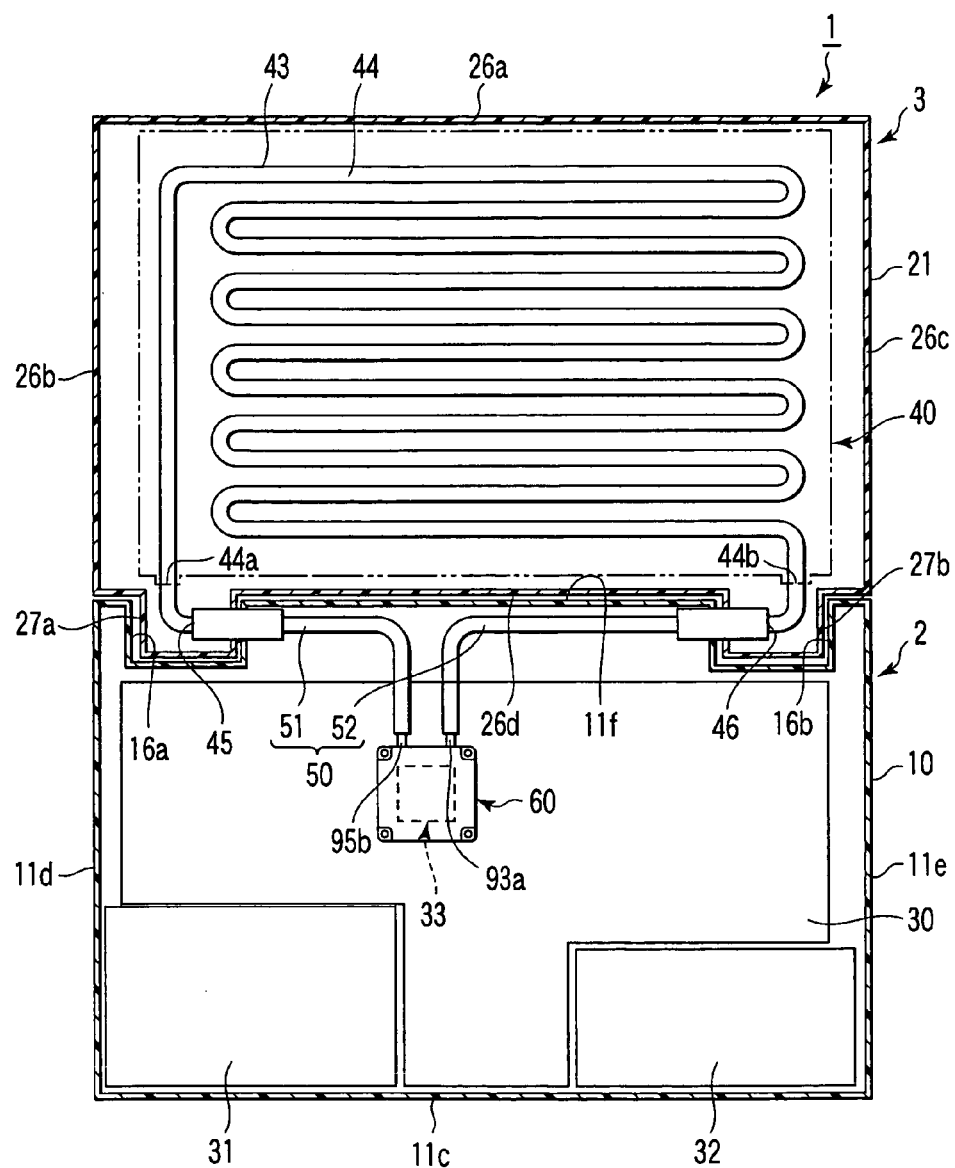
FIG. 2 is a lateral sectional view of the portable computer showing the positional relationship between a pump unit provided in an apparatus main body and a circulation path provided in a display unit.

As shown in FIGS. 1 and 2, the apparatus main body 2 comprises a flat box-shaped housing 10. The housing 10 comprises a bottom wall 11a, an upper wall 11b, a front wall 11c, left and right side walls 11d and 11e and a rear wall 11f. The upper wall 11b has a palm rest 12 and a keyboard attachment portion 13. The keyboard attachment portion 13 is located at the back of the palm rest 12. A keyboard 14 is attached to the keyboard attachment portion 13.

The upper wall 11b has a display support portion 15 at the back of the keyboard 14. The display support portion 15 protrudes upward from the rear end portion of the upper wall 11b, and extends in the width direction of the housing 10. The display support portion 15 has a pair of coupling recess portions 16a and 16b. The coupling recess portions 16a and 16b are separated from each other in the width direction of the housing 10.

As shown in FIGS. 1 and 2, the display unit 3 comprises a liquid crystal display panel 20 and a flat box-shaped display housing 21 which houses the liquid crystal display panel 20.

The liquid crystal display panel 20 has, on its front surface, a screen 20a that displays an image. The display housing 21 comprises a mask 22 and a cover 23. The mask 22 forms a front wall 24 of the display housing 21. The front wall 24 has an opening 24a. The cover 23 forms a rear wall 25 and four side walls 26a to 26d of the display housing 21. The mask 22 and the cover 23 are arranged such that the front wall 24 and the rear wall 25 face each other, thus surrounding the liquid crystal display panel 20.

The liquid crystal display panel 20 is housed in the display housing 21, with the periphery thereof being held by a rubber frame (not shown). The screen 20a of the liquid crystal display panel 20 is exposed to the outside of the display housing 21 through the opening 24a of the front wall 24.

The display housing 21 has a pair of leg portions 27a and 27b protruding from an end thereof. The leg portions 27a and 27b are hollow and separated from each other in the width direction of the display housing 21. The leg portions 27a and 27b are inserted in the coupling recess portions 16a and 16b of the housing 10, and coupled to the housing 10 via hinge devices (not shown).

Thus, the display unit 3 is rotatable between a closed position, at which it flattens to cover the keyboard 14 from above, and an open position, at which the keyboard 14 and the screen 20a is exposed.

As shown in FIG. 2, the housing 10 houses a printed wiring board 30, a hard disk driver 31, a battery pack 32, etc. The printed wiring board 30, the hard disk driver 31 and the battery pack 32 are arranged side by side on the bottom wall 11a of the housing 10.

A CPU 33 as a heat generating component is mounted on the upper surface of the printed wiring board 30. The CPU 33 forms a microprocessor, which is the nucleus of the portable computer 1, and is positioned in the back half of the printed wiring board 30. The CPU 33 has a base board 34, and an IC chip 35 having a square shape in a plan view and arranged in a central portion of the upper surface of the base board 34. As the IC chip 35 is operated at a high processing speed and has many functions, it generates a great amount of heat during operation. Therefore, the IC chip 35 needs cooling to maintain stable operations.

The portable computer 1 incorporates a cooling system of liquid cooling type for cooling the CPU 33. As shown in FIG. 2, the cooling system comprises a heat radiating portion 40, a circulation path 50 and a pump unit 60, which serves also as a heat receiving portion and a heat exchanger.

As shown in FIG. 2, the heat radiating portion 40 is housed inside the display housing 21, that is, between the rear wall 25 of the display housing 21 and the liquid crystal display panel 20. The heat radiating portion 40 has a rectangular plate shape, which is substantially the same in size as the liquid crystal display panel 20.

Figure 3:
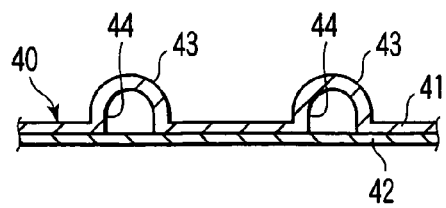
FIG. 3 is a sectional view of a part of a heat radiating portion provided in the display unit.

More specifically, the heat radiating portion 40 comprises a first heat radiating plate 41 and a second heat radiating plate 42 as shown in FIG. 3. The first and second heat radiating plates 41 and 42, made of metal having high thermal conductivity, are put together one on another. The first heat radiating plate 41 has an expanded portion 43 expanded in the opposite direction from the second heat radiating plate 42. As shown in FIG. 2, the expanded portion 43 meanders on substantially the overall surface of the first heat radiating plate 41. The opening end of the expanded portion 43 is closed by the second heat radiating plate 42. Thus, a coolant flow path 44 is formed between the expanded portion 43 of the first heat radiating plate 43 and the second heat radiating plate 42.

As shown in FIG. 2, the heat radiating portion 40 to radiate the heat generated from the CPU 33 has a coolant inlet port 45 and a coolant outlet port 46. The coolant inlet port 45 is located at a left end portion (on the left side in FIG. 2) of the heat radiating portion 40, communicates with an upstream end 44a of the coolant flow path 44, and is close to the left leg portion 27a of the display housing 21. The coolant outlet port 46 is located at a right end portion (on the right side in FIG. 2) of the heat radiating portion 40, communicates with a downstream end 44b of the coolant flow path 44, and is close to the right leg portion 27b of the display housing 21. Thus, the coolant inlet port 45 and the coolant outlet port 46 are separated from each other in the width direction of the display housing 21.

The circulation path 50 causes a liquid coolant (hereinafter referred to as the coolant L) to circulate between the pump unit 60 (to be described later) and the coolant flow path 44 of the heat radiating portion 40, and transfer the heat of the CPU 33 to the heat radiation portion 40 via the coolant L. As shown in FIG. 2, the circulation path 50 has a first coupling pipe 51 and a second coupling pipe 52.

The first coupling pipe 51 extends across the apparatus main body 2 and the display unit 3 and connects between a coolant outlet port 95b of the pump housing 70 (to be described later) and the coolant inlet port 45 of the heat radiating portion 40. The first coupling pipe 51 is led from the inside of the housing 10 to the inside of the display housing 21 through the inside of the display support portion 15 and the inside of the left leg portion 27a.

The second coupling pipe 52 extends across the apparatus main body 2 and the display unit 3 and connects between a coolant inlet port 93a of the pump housing 70 (to be described later) and the coolant outlet port 46 of the heat radiating portion 40. The second coupling pipe 52 is led from the inside of the housing 10 to the inside of the display housing 21 through the inside of the display support portion 15 and the inside of the right leg portion 27b.

As shown in FIGS. 4 to 7, the pump unit 60 comprises the pump housing 70, serving also as a heat receiving portion, a reserve tank 90 having a tank main body 91 and a gas-liquid separating mechanism 92, a rotor 100 having an impeller 101a, an O ring 110, a first cover 111, a stator 120 and a PC board 121 serving as a control section.

The pump housing 70 has a flat rectangular shape and is made of material having a thermal conductivity of 30 W/mK of higher, for example, iron or aluminum. The pump housing 70 has a housing recess portion 71, which opens upward. The housing recess portion 71 is defined by the inner surface of a bottom wall 72, the inner surfaces of four side walls 73a to 73d, and the inner surfaces of four corner portions 74a to 74d shaped as substantially right-triangular columns; that is, the housing recess portion 71 has an octagonal shape in the plan view.

An outer surface of the bottom wall 72 serves as a heat receiving surface 72a, which receives the heat from the CPU 33. The heat receiving surface 72a of the pump housing 70 is larger than a second region T2, which is thermally connected to the CPU 33. In this embodiment, the heat receiving surface 72a is greater than the area of the upper surface of the IC chip 35. A groove 75 is formed in an upper end surface of the pump housing 70, that is, the upper end surfaces of the side walls 73a to 73d and the corner portions 74a to 74d along the periphery of a top opening 71a of the housing recess portion 71. The O ring 110 is provided along the groove 75.

A recess portion 78 is formed in each of the four corner portions 74a to 74d. The recess portions 78 form an attachment mechanism to fix the pump unit 60 to the printed wiring board 30. A through hole 79, which allows passage of a cylindrical insert 80 as a part of the attachment mechanism, is formed in a bottom wall 78a defining the recess portion 78. The attachment mechanism will be described later. Screw receiving portions 86 are formed on both sides of the recess portion 78 (see FIG. 6).

Figure 7:
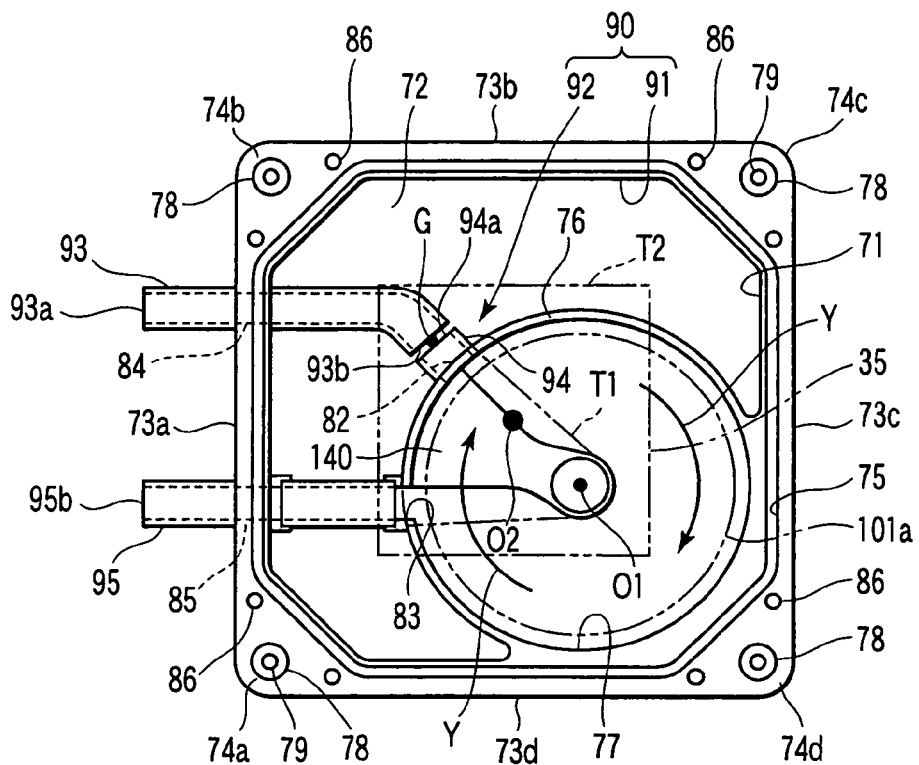
FIG. 7 is a plan view showing the pump unit with the first and second covers omitted.

A partition member 76 rises from the inner surface of the bottom wall 72 defining the housing recess portion 71. It serves as a partition that isolates a space having a circular shape in a plan view from the housing recess portion 71. The circular space is formed in proximity to one of the four corner portions 74a to 74d, for example, the corner portion 74d. The housing recess portion 71 is divided by the partition member 76 into a pump chamber 77 having a circular shape in a plan view and a remainder space surrounding the pump chamber 77 from the side of the three corner portions 74a to 74c. In other words, the pump chamber 77, which houses the impeller 101a, is defined by a part of the bottom wall 72 of the pump housing 70 and the partition member 76. The remainder space corresponds to the tank main body 91 to be described later. As shown in FIG. 7, first and second communicating holes 82 and 83, which connect the inside and the outside of the pump chamber (the inside of the pump chamber 77 and the inside of the tank main body 91), are formed in the partition member 76. Further, third and fourth communicating holes 84 and 85, which connect the inside of the tank main body 91 and the outside of the pump housing 70, are formed in the side walls 73*a* to 73*d* of the pump housing defining the tank main body, for example, the side wall 73*a*. The portions where the third and fourth communicating holes 84 and 85 are formed are not limited to the side wall 73*a*. The third and fourth communicating holes 84 and 85 may be formed in a region which defines the tank main body 91. The third and fourth communicating holes 84 and 85 may be formed in different side walls.

The reserve tank 90 comprises the tank main body 91 as a reservoir which stores liquid, a first pipe 93, a second pipe 94, a third pipe 95, etc. The first pipe 93 and the second pipe 94 form the gas-liquid separating mechanism 92.

One end portion of the first pipe 93 has a coolant inlet port 93*a* to supply the coolant L into the pump unit 60. The other end portion thereof has a discharge port 93*b* to discharge the coolant L into the tank main body 91. The first pipe 93 is inserted into the tank main body 91 through the third communicating hole 84 from the outside of the pump housing 70. The coolant inlet port 93*a* of the first pipe 93, protruding from the side wall 73*a* to the outside of the pump housing 70 (toward the rear of the housing 10), is connected to the second coupling pipe 52 of the circulation path 50 (see FIG. 2). The discharge port 93*b* is located inside the tank main body 91 and open to the inside of the tank main body 91. In the reserve tank 90, the discharge port 93*b* is located at or near the barycenter of the tank main body 91 (hereinafter referred to as a barycenter portion G).

One end of the second pipe 94 has an inflow port 94*a* through which the coolant L stored in the tank main body 91 flows in. The inflow port 94*b* is located inside the tank main body 91 and open to the inside of the tank main body 91. The inflow port 94*a* as well as the discharge port 93*b* is located at the barycenter portion G in the tank main body 91. Thus, the inflow port 94*a* and the discharge port 93*b* face each other at the barycenter portion G in the tank main body 91. The inflow port 94*a* and the discharge port 93*b* are located under an initial liquid surface $F_0$ of the coolant L in the state where the coolant L is stored in the tank main body 91, so that they are always kept submerged under the coolant L (see FIGS. 8 and 9).

The other end of the second pipe 94 communicates with the first communicating hole 82. In other words, the inside of the pump chamber 77 and the inside of the tank main body 91 are connected through the second pipe 94. As a result, the coolant L transferred from the tank main body 91 flows into the pump chamber 77 through the communicating hole 82.

One end of the third pipe 95 communicates with the second communicating hole 83. The other end of the third pipe 95 has the coolant outlet port 95*b*, through which the coolant L flows out of the pump unit 60. The third pipe 95 connects the inside of the pump chamber 77 and the outside of the pump housing 70 through the second communicating hole 83 and the fourth communicating hole 85. The coolant outlet port 95*b* of the third pipe 95, protruding from the side wall 73*a* to the outside of the pump housing 70 (toward the rear of the housing 10), is connected to the first coupling pipe 51 of the circulation path 50.

With the above structure, the reserve tank 90 storing the coolant L can be incorporated in the pump unit 60. In addition, the reserve tank 90 can be interposed in the circulation path 50 by connecting the first pipe 93 to the second coupling pipe 52 and connecting the third pipe 95 to the first coupling pipe 51.

It is preferable that the gas-liquid separating mechanism 92 be arranged in a region corresponding to the second region T2 where the pump housing (heat receiving portion) 70 is thermally connected to the CPU 33, as shown in FIG. 7. In this embodiment, the second region T2 corresponds to a region where the IC chip 35 is thermally connected to the heat receiving surface 72*a*. With the gas-liquid separating mechanism 92 arranged as described above, the first pipe 93 can be heated by the heat generated from the CPU 33. Therefore, if gas is trapped in the first pipe 93, the gas is expanded and satisfactorily discharged in the tank main body 91 through the gas-liquid separating mechanism 92 (between the discharge port 93*b* and the inflow port 94*a*).

The rotor 100 is housed in the pump chamber 77. The rotor 100 comprises a rotor assembly 101 and a shaft 102. The rotor assembly 101 comprises the impeller 101*a*, a magnet (not shown), and a rotor yoke, the ends of which form a pair of protrusion poles (not shown). The shaft 102, made of metal, is passed through a center O1 of each of the rotor yoke, the magnet and the impeller 101*a*, and fixes the rotor yoke, the magnet and the impeller 101*a*. The shaft 102 is rotatably supported by the pump housing 70.

The impeller 101*a* has a plurality of vanes 101*b*. The vanes 101*b* extend radially from the center O1 of the impeller 101*a*.

Figure 4:
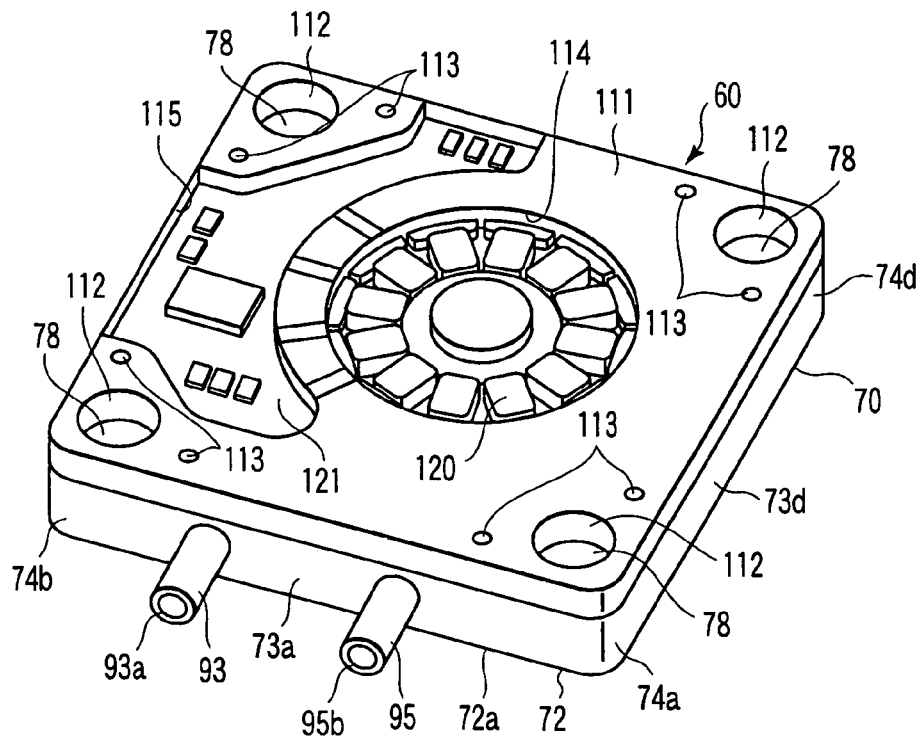
FIG. 4 is a perspective view showing the pump unit provided in the portable computer with a second cover omitted.
Figure 5:
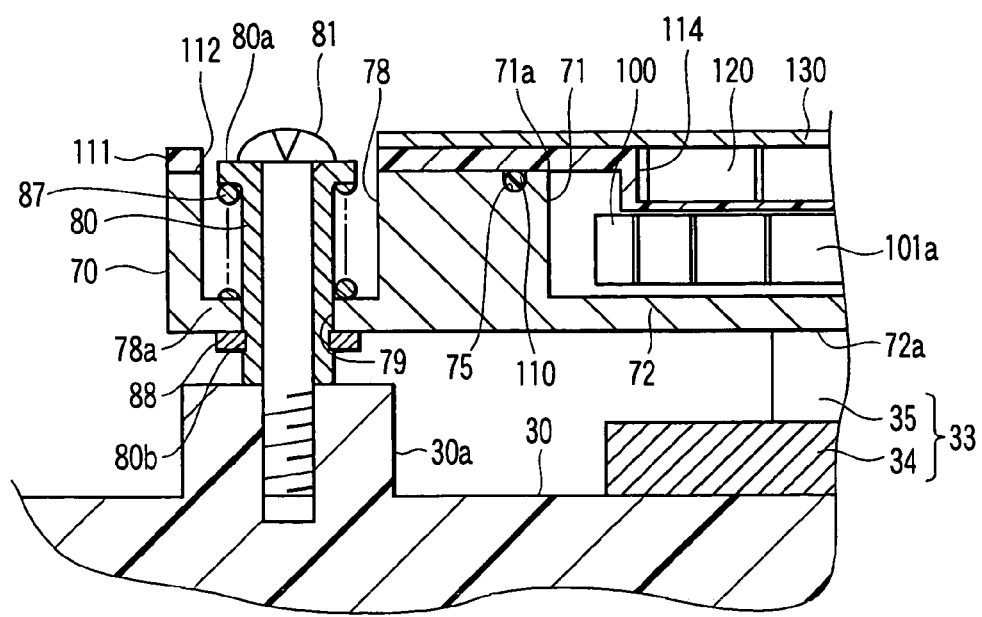
FIG. 5 is a vertical sectional view of a part of the apparatus main body showing a fixed structure of the pump unit.
Figure 6:
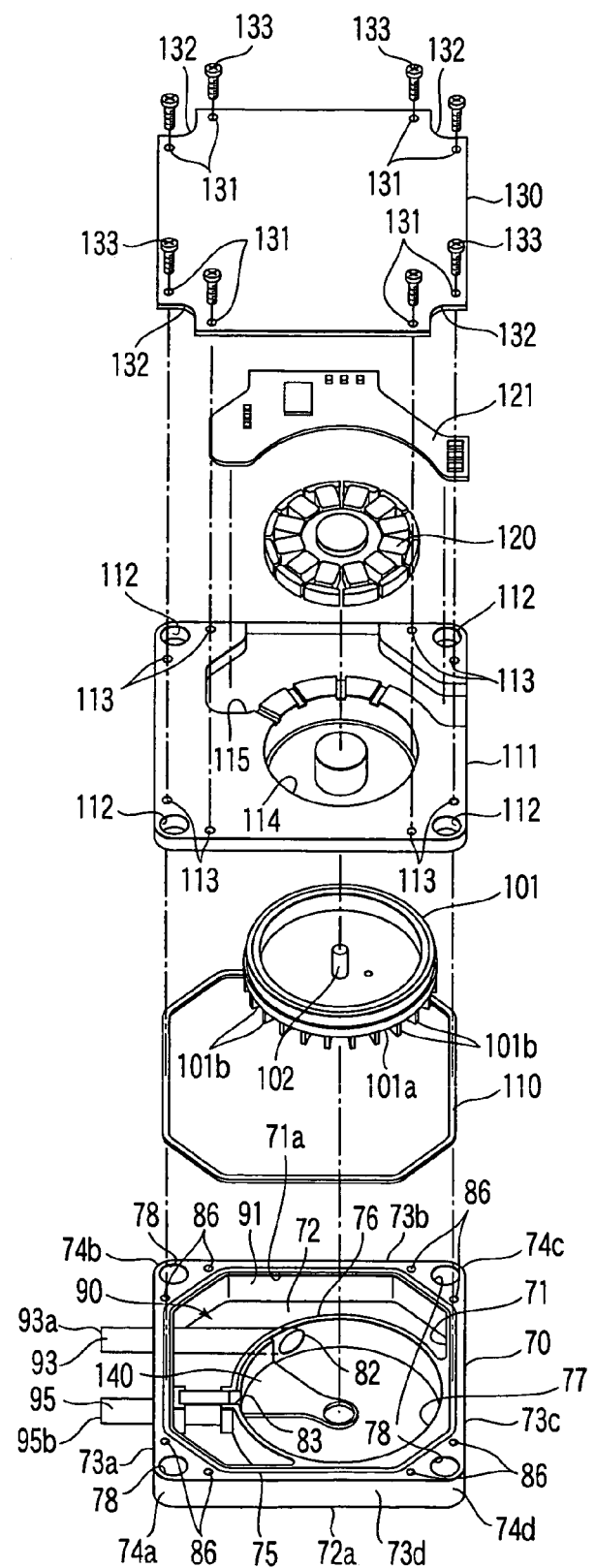
FIG. 6 is an exploded perspective view showing the pump unit.

As shown in FIGS. 4 to 6, the first cover 111, made of resin, is shaped as a square plate. Each of the corner portions of the first cover 111 has a hole portion 112 of the diameter substantially the same as that of the recess portion 78. Screw through holes 113 are formed on both sides of the hole portion 112. The first cover 111 is provided above the pump housing 70 so as to cover the top opening 71*a* of the housing recess portion 71. Since the O ring 110 is provided at the upper edge of the pump housing 70, the housing recess portion 71 and the tank main body 91 are liquid-tight by closing the top opening 71*a* of the pump housing 70 with the first cover 111. When the first cover 111 is stacked on the pump housing 70 to cover the top opening 71*a*, the inner periphery of the hole portion 112 is continuos to the inner surface of the recess portion 78 of the pump housing 70.

A first recess portion 114, which houses the stator 120, and a second recess portion 115, which house the PC board 121, are provided on the upper surface of the first cover 111. The stator 120 is housed in the first recess portion 114 so that the center thereof coincides with the center of the rotor 100 (the axial line of the shaft 102). The second recess portion 115 is formed at a position other than the position of the first recess portion 114.

Even when the first cover 111 covers the pump housing 70, the coolant L may be seeped out of the pump housing 70 or evaporated. If the first cover 111 is made of resin, in particular, the coolant L is easily seeped out of the pump housing 70 or evaporated. Therefore, in the portable computer 1, a second cover 130 made of metal further covers the first cover 111 over the pump housing 70.

More specifically, the second cover 130 is substantially shaped as a rectangle, the corner portions of which are cut off (see FIG. 6). Screw through holes 131 are provided on both sides of the cut-off portion of each corner portion. The second cover 130 is fixed to the pump housing 70 by screwing screws 133 in the screw receiving portions 86 of the pump housing 70 through the screw through holes 131 of the second cover and the screw through holes 113 of the first cover.

In the pump unit 60 of the structure described above, the rotor 100 is rotated to transfer the coolant L by applying power to the stator 120. Since power is applied to the stator 120 with the magnetization phase successively changed, a rotary magnetic field is generated in the circumferential direction of the stator 120 accordingly. The magnetic field magnetically couples with the magnet of the rotor 100, so that torque is generated between the stator 120 and the magnet. As a result, the rotor 100 with the impeller 101*a* rotates in the direction of an arrow Y shown in FIG. 7. The rotor 100 is rotated, for example when the portable computer 1 is powered on or the temperature of the CPU 33 rises to a predetermined value. The application of power to the stator 120 is controlled by the PC board 121.

The pump unit 60 is housed in the housing 10 and mounted on the upper surface of the printed wiring board 30. Four boss portions 30*a* are formed in the printed wiring board 30 at positions corresponding to the corner portions 74*a* to 74*d* of the pump housing 70 (in FIG. 5, only one boss portion 30*a* is shown).

The attachment mechanism comprises a cylindrical insert 80, a screw 81, a coil spring 87 and a C ring 88. The insert 80 has a flange portion 80*a* protruding outward horizontally from the outer periphery of its upper end portion along the circumferential direction. Further, a groove 80*b* is formed in the outer periphery of the insert 80 along the circumferential direction.

The pump unit 60 is pressed against the CPU 33 by the attachment mechanism as described below (see FIG. 5). First, the insert 80 is inserted through the coil spring 87. The insert 80 is inserted in the opening of the hole portion 112 of the first cover 111, and passed through the through hole 79. The groove portion 80*b* is positioned below the heat receiving surface 72*a* of the pump unit 60, and the C ring 88 is fitted into the groove portion 80*b*. As a result, the insert 80 is attached to the pump unit 60 in the state where the flange portion 80*a* is forced away from the bottom wall 78*a* by means of the coil spring 87.

Conductive grease (not shown) is applied to the upper surface of the IC chip 35, and the heat receiving surface 72*a* of the pump housing 70 is caused to face the IC chip 35. The screw 81 passed through the insert 80 is screwed in the boss portion 30*a* of the printed wiring board 30. Thus, the insert 80 is fixed to the boss portion 30*a*. As a result, the pump unit 60 is pressed against the IC chip 35 by the elasticity of the coil spring 87. Consequently, the IC chip 35 of the CPU 33 is thermally connected to the heat receiving surface 72*a* of the pump housing 70 via the conductive grease.

In the portable computer 1, the pump unit 60 is fixed to the printed wiring board 30 so that the center of the pump unit 60 (the center of the heat receiving surface) coincides with the center O2 of the IC chip 35 (which coincides with the center of the CPU 33 in this embodiment). On the other hand, in the pump unit 60, the center O1 of the impeller 101*a* is deviated from the center of the pump unit 60. Therefore, the center O2 of the IC chip 35 is deviated from the center O1 of the impeller 101*a*, which faces the IC chip 35 via the pump housing 70 (see FIG. 7). Further, the impeller 101*a* has a radius longer than the distance between the center O1 of the impeller 101*a* and the center O2 of the IC chip 35. In other words, the length of each of the vanes 101*b* is longer than the distance between the center O1 of the impeller 101*a* and the center O2 of the IC chip 35. Thus, the pump unit 60 is arranged such that the peripheral portion of the impeller 101*a* overlaps the center O2 of the IC chip 35.

Further, the pump unit 60 has a projecting portion 140 in a first region T1 of the inner surface of the bottom wall 72. The first region T1 is formed by connecting the first communicating hole 82, the second communicating hole 83 and the center O1 of the impeller 101*a* (see FIG. 6). The projecting portion 140 is a so-called side channel employed in a side-channel pump. It is preferable that the first region T1 of the pump unit 60 overlap the position of the center O1 of the CPU 33. Particularly preferably, the projecting portion 140 of the pump unit 60 covers the position of the center O1 of the CPU 33 (see FIG. 7).

With the arrangement described above, the CPU 33 as a heat generating component can be cooled more efficiently.

The pump chamber 77 of the pump unit 60, the tank main body 91 of the reserve tank 90, the coolant flow path 44 of the heat radiating portion 40 and the circulation path 50 are filled with the coolant L as a liquid cooling agent. For example, an antifreezing solution containing an aqueous solution of ethylene glycol, to which a corrosion inhibitor is added if necessary, can be used as the coolant L.

In the structure as described above, the IC chip 35 of the CPU 33 generates heat while the portable computer 1 is used. Since the IC chip 35 is thermally connected to the heat receiving surface 72*a* of the pump housing 70, the heat of the IC chip 35 is transferred to the pump housing 70. The pump chamber 77 of the pump housing 70 is filled with the coolant L, which absorbs a large-amount of heat generated from the IC chip 35 transferred to the pump housing 70.

When the IC chip 35 is heated to a predetermined temperature, power is applied to the stator 120 with the magnetization phase successively changed. As a result, torque is generated between the stator 120 and the magnet of the rotor 100, so that the rotor 100 with the impeller 101*a* rotates. When the rotor 100 is rotated, the coolant L circularly flows in the pump chamber 77 and sent out to the heat radiating portion 40 through the second communicating hole 83 and the third pipe 95. Thus, the coolant L is forced to circulate between the pump unit 60 and the heat radiating portion 40.

More specifically, the coolant L heated by the heat exchange in the pump chamber 77 is supplied to the first coupling pipe 51 of the circulation path 50 through the third pipe 95. The coolant L supplied to the first coupling pipe 51 is transferred to the heat radiating portion 40, and the heat is radiated from the heat radiating portion 40 to the outside of the portable computer 1. The coolant L cooled by the heat exchange in the heat radiating portion 40 is returned to the pump unit 60 through the second coupling pipe 52 of the circulation path 50. The coolant L returned to the pump unit 60 flows through the first pipe 93 and discharged through the discharge port 93*b* into the tank main body 91.

The reserve tank 90 includes the gas-liquid separating mechanism 92 described above. If bubbles X are trapped in the coolant L flowing through the first pipe 93 (see FIG. 9), they move upward in the coolant L inside the tank main body 91 and collected in an air layer A in an upper portion of the tank main body 91. Therefore, even if the bubbles X are trapped in the coolant L, they can be discharged out of the discharge port 93*b* of the first pipe 93. As a result, the bubbles X can be separated from the coolant L.

Further, since the inflow port 94*a* is submerged under the coolant L stored in the tank main body 91, the coolant L in the tank main body 91 is caused to flow into the pump chamber 77 through the second pipe 94. Thus, the gas-liquid separating mechanism 92 (the first and second pipes 93 and 94) not only separates bubbles from the coolant L but also forms a part of the path for circulating the coolant L between the pump housing 70 and the heat radiating portion 40.

The coolant L guided to the pump chamber 77 again absorbs the heat from the IC chip 35 and is sent out to the heat radiating portion 40 through the third pipe 95 and the first coupling pipe 51. As a result, the heat generated in the IC chip 35 is successively transferred to the heat radiating portion 40 via the circulating the coolant L, and discharged out of the portable computer 1 through the heat radiating portion 40.

Figure 8:
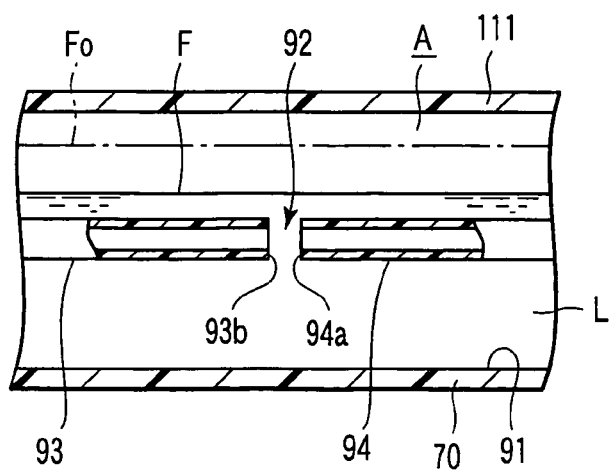
FIG. 8 is a sectional view showing a part of a reserve tank provided in the pump unit.
Figure 9:
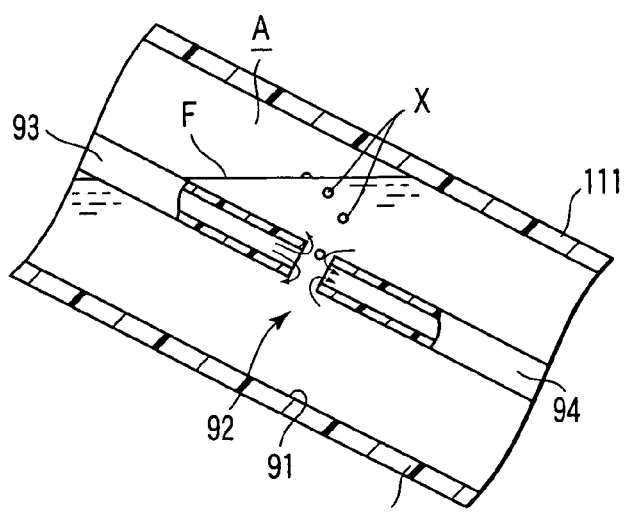
FIG. 9 is a sectional view showing the relationship between a gas-liquid separating mechanism and the liquid surface when the posture of the reserve tank changes.

When the portable computer 1 is carried or transported, the posture of the housing 10 incorporating the reserve tank 90 is changed. Therefore, the posture of the reserve tank 90 is changed in various directions as shown in FIGS. 8 and 9. Accordingly, the liquid surface F of the coolant L changes.

Even in such a case, according to this embodiment, the inflow port 94a of the second pipe 94 is always located under an initial liquid surface $F_0$ of the coolant L, because the discharge port 93b of the first pipe 93 and the inflow port 94a of the second pipe 94 face at the barycenter portion G of the tank main body 91. Therefore, the inflow port 94a of the second pipe 94 is kept submerged under the coolant L.

Further, since the inflow port 94a of the second pipe 94 is located at the barycenter portion G, even if the coolant L stored in the tank main body 91 reduces and the liquid surface F lowers, the inflow port 94a will not open to the air layer A in the tank main body 91 before the coolant L is reduced to substantially half of the tank main body 91 or less. Therefore, air is prevented from entering into the pump chamber 77 or the circulation path 50 from the inflow port 94a. Consequently, the heat of the CPU 33 can be efficiently absorbed by the coolant L.

Furthermore, since the center O1 of the impeller 101a is deviated from the center O2 of the IC chip 35 as described above, a greater amount of heat of the IC chip 35 can be absorbed by the coolant L. The IC chip 35 preferably faces a position where the coolant L flows at a higher speed with the pump housing 70 (a heat receiving portion) interposed therebetween so that the coolant L can absorb a greater amount of heat from the IC chip 35. As well known, the flow rate of the coolant L caused by the rotation of the rotor 100 increases with the distance from the center O1 of the impeller 101a. Therefore, with the arrangement of the pump unit 60 such that the center O1 of the impeller 101a is deviated from the center O2 of the CPU 33 or the outer periphery thereof overlaps the center O2 of the CPU 33, a greater amount of heat from the IC chip 35 can be absorbed by the coolant L. The arrangement of the pump unit 60 such that the projecting portion (side channel) 140 overlaps the center O2 of the CPU 33 is also advantageous in that a greater amount of heat from the IC chip 35 can be absorbed by the coolant L.

As described above, with the gas-liquid separating mechanism 92 of this embodiment, the discharge port 93b and the inflow port 94a face each other in the coolant L stored in the tank main body 91. Further, in this embodiment, the gas-liquid separating mechanism 92 is provided in the reserve tank 90. Therefore, the bubbles X in the coolant L in the heat radiating portion 40 or the circulation path 50 can be separated from the coolant L and collected in the air layer A in the upper portion of the tank main body 91 with the simple structure. Consequently, the CPU 33 can be efficiently cooled by applying the gas-liquid separating mechanism 92 and the reserve tank 90 to the portable computer.

In addition, air is prevented from entering into the pump chamber 77 or the circulation path 50 from the inflow port 94a with the simple structure of the discharge port 93b and the inflow port 94a facing each other at the barycenter portion G of the tank main body 91. Thus, the structure of the cooling system is simplified and the manufacturing cost is reduced without adding a complicated gas-liquid separating mechanism to the reserve tank 90.

Further, in the portable computer 1 of this embodiment, the pump unit 60 is arranged such that the center of the impeller 101a is deviated from the center of the CPU 33, and that the outer periphery of the impeller 101a overlaps the center O2 of the CPU 33. Thus, since the CPU 33 faces a portion where the coolant L flows at a high rate with the pump housing 70 interposed therebetween, a greater amount of heat from the CPU 33 is absorbed by the coolant L. Furthermore, the pump unit 60 is arranged such that the projecting portion (side channel) 140 overlaps the center O2 of the CPU 33. Therefore, a greater amount of heat from the IC chip 35 can be absorbed by the coolant L. Consequently, the CPU 33 can be efficiently cooled.

Moreover, in the portable computer 1 of this embodiment, the second cover 130 made of metal covers the pump unit 60 over the first cover 111. Therefore, seeping out of the coolant L from the pump unit 60 is suppressed by the second cover 130. Consequently, the CPU 33 can be efficiently cooled by the coolant L. In addition, since the coolant L stays long in the cooling system, the cooling effect of the CPU 33 is maintained for a long time and there is no need of replenishing the coolant L.

Furthermore, in the portable computer 1 of this embodiment, the pump unit 60 has the reserve tank 90, which is interposed in the circulation path 50 and stores the coolant L. Therefore, the heat generating component, such as the CPU 33, can be efficiently cooled by applying the pump unit 60 as described above with a simple structure. Moreover, since the assembly of the cooling system is simplified, the manufacturing cost is reduced.

A second embodiment of the present invention will be described below with reference to FIG. 10.

Figure 10:
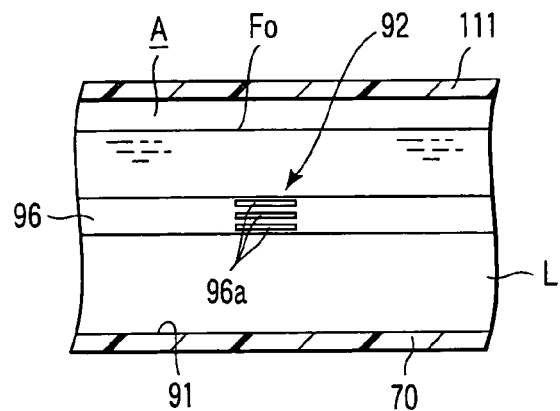
FIG. 10 is a sectional view showing a part of a reserve tank of a pump unit provided in a portable computer according to a second embodiment of the present invention.

The portable computer 1 comprises a reserve tank 90 as shown in FIG. 10. The reserve tank 90 comprises a pipe 96 in place of the first pipe 93 and the second pipe 94 of the first embodiment. One end of the pipe 96 is connected to the first communicating hole 82. The other end of the pipe 96 has the coolant outlet port 95b through which the coolant L flows out of the pump unit 60. The pipe 96 connects the inside of the pump chamber 77 and the outside of the pump housing 70 through the third communicating hole 84. The coolant outlet port 95b of the pipe 96, protruding from the side wall 73a to the outside of the pump housing 70 (toward the rear of the casing 10), is connected to the second coupling pipe 52 of the circulation path 50.

The pipe 96 has distribution ports 96a, which allow passage of the liquid, in an intermediate portion thereof. The distribution ports 96a are realized by forming a plurality of slits in the wall that forms the pipe 96. The pipe 96 is arranged such that the distribution ports 96a are located inside the tank main body 91. In this embodiment, the distribution ports 96a are located at the barycenter portion G of the tank main body 91. In the state where the coolant L is stored in the tank main body 91, the distribution ports 96a are submerged in the coolant L in the tank main body 91. The other structures, including the portions not shown in the drawings, are the same as those of the first embodiment described above. Therefore, the same parts are identified by the same reference symbols and redundant description will be omitted.

In this embodiment, the pipe 96 forms the gas-liquid separating mechanism 92. If bubbles X are trapped in the coolant L flowing through the pipe 96, they are discharged through the distribution ports 96a into the tank main body 91, move up in the coolant L in the tank main body 91, and are collected in the air layer A in the upper portion of the tank main body 91. Thus, even if bubbles X are trapped in the coolant L, they can be discharged through the distribution ports 96a of the pipe 96 and separated from the coolant L by the gas-liquid separating mechanism 92.

As described above, according to the gas-liquid separating mechanism 92 of the second embodiment, the pipe 96 is arranged such that the distribution ports 96a formed therein are located inside the tank main body 91. Therefore, the bubbles X trapped in the coolant L in the heat radiating portion 40 or the circulation path 50 can be separated from the coolant L and collected in the air layer A in the upper portion of the tank main body 91. Consequently, the CPU 33 can be efficiently cooled by applying the gas-liquid separating mechanism 92 and the reserve tank 90 as described above to the portable computer 1.

In addition, air is prevented from entering into the pump chamber 77 or the circulation path 50 through the inflow port 94a with the simple structure of the distribution ports 96a provided at the barycenter portion G. Thus, because it is unnecessary to add a complicated gas-liquid separating mechanism to the reserve tank 90, the structure of the cooling system is simplified and the manufacturing cost is reduced.

In the second embodiment, a plurality of slits are provided as the distribution ports 96a. However, the shape and the number of the distribution ports 96a are not limited to those in this embodiment.

A third embodiment of the present invention will be described below with reference to FIG. 11.

Figure 11:
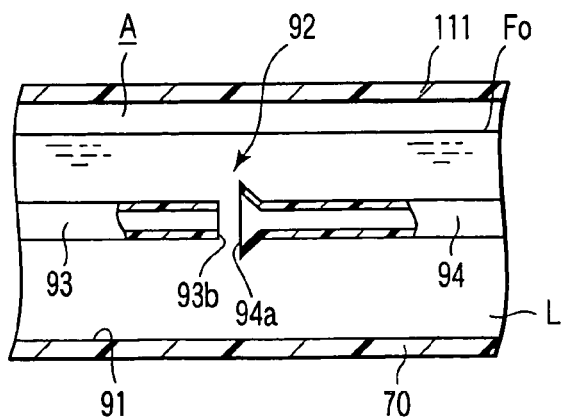
FIG. 11 is a sectional view showing a part of a reserve tank of a pump unit provided in a portable computer according to a third embodiment of the present invention.

The portable computer 1 of this embodiment comprises the reserve tank 90 as shown in FIG. 11. The open end of the inflow port 94a of the second pipe 94 is widened toward the first pipe 93. The other structures, including the portions not shown, are the same as those of the first embodiment described above. Therefore, the same parts are identified by the same reference symbols and redundant description will be omitted.

According to this embodiment, since the open end of the inflow port 94a of the second pipe 94 is widened toward the first pipe 93, the coolant L in the tank main body 91 can be efficiently taken through the second pipe 94 and supplied to the pump chamber 77.

A fourth embodiment of the present invention will be described with reference to FIG. 12.

Figure 12:
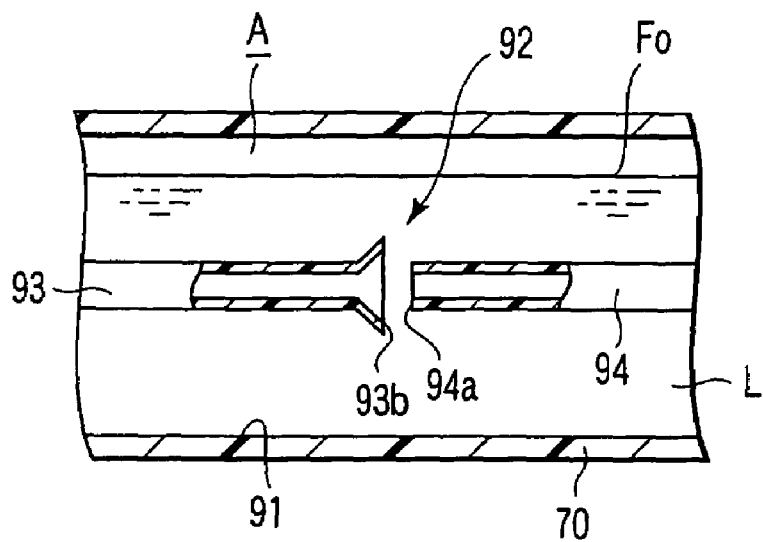
FIG. 12 is a sectional view showing a part of a reserve tank of a pump unit provided in a portable computer according to a fourth embodiment of the present invention.

The portable computer 1 of the fourth embodiment comprises the reserve tank 90 as shown in FIG. 12. The open end of the discharge port 93b of the first pipe 93 is widened toward the second pipe 94. The other structures, including the portions not shown, are the same as those of the first embodiment described above. Therefore, the same parts are identified by the same reference symbols and redundant description will be omitted.

According to the fourth embodiment, since the open end of the discharge port 93b is widened toward the second pipe 94, the coolant L flowing through the first pipe 93 can be efficiently discharged into the tank main body 91. Moreover, the bubbles in the first pipe 93 can be efficiently discharged into the tank main body 91. Therefore, the gas-liquid separating capacity of the gas-liquid separating mechanism 92 can be improved.

A fifth embodiment of the present invention will be described below with reference to FIG. 13.

Figure 13:
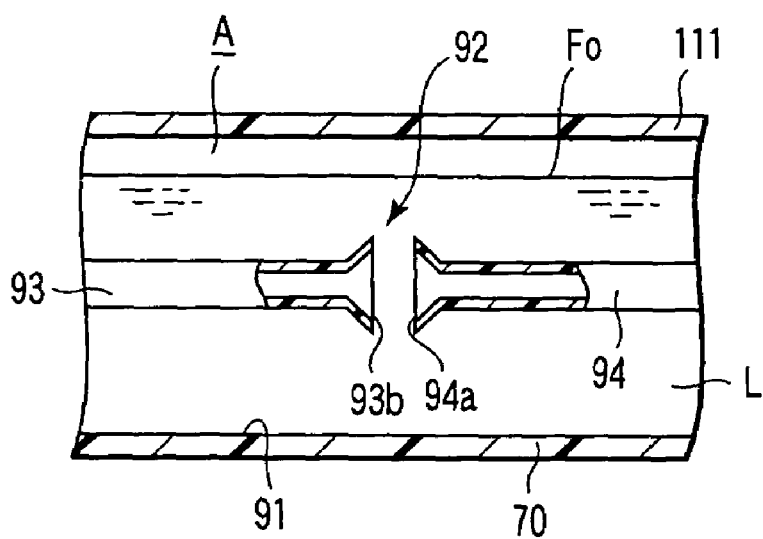
FIG. 13 is a sectional view showing a part of a reserve tank of a pump unit provided in a portable computer according to a fifth embodiment of the present invention.

The portable computer 1 of the fifth embodiment comprises the reserve tank 90 as shown in FIG. 13. The open end of the discharge port 93b of the first pipe 93 is widened toward the second pipe 94. The open end of the inflow port 94a of the second pipe 94 is widened toward the first pipe 93. The other structures, including the portions not shown, are the same as those of the first embodiment described above. Therefore, the same parts are identified by the same reference symbols and redundant description will be omitted.

According to the fifth embodiment, since the open end of the discharge port 93b is widened toward the second pipe 94, the coolant L flowing through the first pipe 93 can be efficiently discharged into the tank main body 91 and the gas-liquid separating capacity of the gas-liquid separating mechanism can be improved. In addition, since the open end of the inflow port 94a is widened toward the first pipe 93, the coolant L in the tank main body 91 can be efficiently taken through the second pipe 94 and supplied to the pump chamber 77.

The gas-liquid separating mechanism of the present invention is widely applicable to not only the reserve tank but also anything that has a reservoir portion for storing liquid. The reserve tank having the gas-liquid separating mechanism may be independent of the pump unit.

The electronic apparatus of the present invention is not limited to the portable computer. The present invention is applicable to various types of electronic apparatus, which incorporates a heat generating body, such as a circuit part that generates a large amount of heat.

What is claimed is:

1. An electronic apparatus comprising:
    a housing having a heat generating component;
    a heat radiating portion which radiates heat generated by the heat generating component;
    a pump unit having an impeller and a heat receiving portion thermally connected to the heat generating component, wherein a center of the impeller is deviated from a center of the heat generating component and the pump unit supplies liquid to the heat radiating portion by rotating the impeller; and
    a circulation path which circulates the liquid between the heat receiving portion and the heat radiating portion and transfers the heat generated by the heat generating component to the heat radiating portion through the liquid,
    wherein the pump unit includes a reserve tank which is interposed in the circulation path and stores the liquid.

2. The electronic apparatus according to claim 1, wherein the pump unit includes:
    a pump housing having the heat receiving portion and a housing recess portion;
    the impeller provided in the housing recess portion;
    a rotor provided in the impeller;
    a first cover which covers the housing recess portion;
    a stator mounted to face the rotor via the first cover; and
    a control section which controls power to be applied to the stator.

3. The electronic apparatus according to claim 2, wherein:
    the first cover has a first recess portion which houses the stator and a second recess portion which houses the control section on a surface opposite to a surface facing the rotor; and
    the second recess portion is formed at a position other than that of the first recess portion.

4. The electronic apparatus according to claim 2, wherein the pump unit includes a second cover which covers the pump housing over the first cover.

5. The electronic apparatus according to claim 4, wherein the first cover is made of resin and the second cover is made of metal.

6. The electronic apparatus according to claim 1, wherein the reserve tank includes a tank main body which stores the liquid and a gas-liquid separating mechanism, the gas-liquid separating mechanism including a first pipe having a discharge port through which the liquid is discharged, and a second pipe having an inflow port through which the liquid flows in, the discharge port and the inflow port being located in the tank main body and facing each other inside the tank main body.

7. The electronic apparatus according to claim 6, wherein the discharge port and the inflow port faces each other near a barycenter portion of the tank main body.

8. The electronic apparatus according to claim 1, wherein the reserve tank includes a tank main body which stores the liquid and a gas-liquid separating mechanism, the gas-liquid separating mechanism including a pipe having a distribution port which allows passage of the liquid, the distribution port being located inside the tank main body.

9. The electronic apparatus according to claim 8, wherein the distribution port is located near a barycenter portion of the tank main body.

10. An electronic apparatus comprising:
a housing having a heat generating component;
a heat radiating portion which radiates heat generated by the heat generating component;
a pump unit having an impeller and a heat receiving portion thermally connected to the heat generating component, wherein the pump unit supplies liquid to the heat radiating portion by rotating the impeller; and
a circulation path which circulates the liquid between the heat receiving portion and the heat radiating portion and transfers the heat generated by the heat generating component to the heat radiating portion through the liquid,
wherein the pump unit includes a reserve tank which is interposed in the circulation path and store the liquid.

11. The electronic apparatus according to claim 10, wherein the pump unit includes:
a pump housing having the heat receiving portion and a housing recess portion;
the impeller provided in the housing recess portion;
a rotor provided in the impeller;
a first cover which covers the housing recess portion;
a stator mounted to face the rotor via the first cover; and
a control section which controls power to be applied to the stator.

12. An electronic apparatus comprising:
a housing having a heat generating component;
a heat radiating portion which radiates heat generated by the heat generating component;
a pump unit having an impeller and a heat receiving portion thermally connected to the heat generating component, wherein the pump unit supplies liquid to the heat radiating portion by rotating the impeller; and
a circulation path which circulates the liquid between the heat receiving portion and the heat radiating portion and transfers the heat generated by the heat generating component to the heat radiating portion through the liquid,
wherein:
the pump unit includes a partition wall, a pump housing having a bottom wall, and a pump chamber defined by at least a part of the bottom wall and the partition wall and housing the impeller;
the partition wall has first and second communicating holes which communicate inside and outside of the pump chamber;
the bottom wall has a first region on an inner surface thereof, the first region being formed by connecting the first communicating hole, the second communicating hole and a center of the impeller; and
the pump unit is arranged such that an outer periphery of the impeller overlaps a center of the heat generating component.

13. The electronic apparatus according to claim 12, wherein:
the first region has a projecting portion; and
the pump unit is arranged such that a region corresponding to the projecting portion overlaps the center of the heat generating component.

14. The electronic apparatus according to claim 12, wherein:
the heat receiving portion has a second region thermally connected to the heat generating component; and
the pump unit has a gas-liquid separating mechanism in a region corresponding to the second region.

15. The electronic apparatus according to claim 14, wherein the gas-liquid separating mechanism includes a reservoir portion which stores the liquid, a first pipe having a discharge port through which the liquid is discharged, and a second pipe having an inflow port through which the liquid flows in, the discharge port and the inflow port opening in the reservoir portion and facing each other in the liquid stored in the reservoir portion.

16. The electronic apparatus according to claim 15, wherein the discharge port of the first pipe has an open end, whose diameter is widened toward the second pipe.

17. The electronic apparatus according to claim 15, wherein the inflow port of the second pipe has an open end, whose diameter is widened toward the first pipe.

18. The electronic apparatus according to claim 16, wherein the inflow port of the second pipe has an open end, whose diameter is widened toward the first pipe.

19. The electronic apparatus according to claim 14, wherein the gas-liquid separating mechanism includes a pipe having a distribution port which allows passage of the liquid, the pipe being arranged such that the distribution port is located in the liquid stored in the reservoir portion.

* * * * *